US012575037B2

(12) United States Patent

Villanueva Ponce et al.

(10) Patent No.: US 12,575,037 B2

(45) Date of Patent: Mar. 10, 2026

(54) BUSSED ELECTRICAL CENTER ASSEMBLY WITH SHOCK ABSORBING BEAMS

(71) Applicant: Aptiv Technologies AG, Schaffhausen (CH)

(72) Inventors: Rodrigo Villanueva Ponce, Royal Oak, MI (US); Jonathan Minjares, Chihuahua (MX); Alvaro De La Reza, El Paso, TX (US); Daniel Eichorn, Auburn Hills, MI (US); Luis Franco Villanueva, Chihuahua (MX)

(73) Assignee: Aptiv Technologies AG, Schaffhausen (CH)

( * ) Notice: Subject to any disclaimer, the term of this patent is extended or adjusted under 35 U.S.C. 154(b) by 113 days.

(21) Appl. No.: 18/402,800

(22) Filed: Jan. 3, 2024

(65) Prior Publication Data

US 2025/0220827 A1      Jul. 3, 2025

(51) Int. Cl.
*H05K 5/00*               (2025.01)

(52) U.S. Cl.
CPC .................................. *H05K 5/0056* (2013.01)

(58) Field of Classification Search
CPC .. H05K 5/0052; H05K 5/0056; H05K 5/0006; H05K 5/0217; H05K 5/0069; H05K 5/10; H05K 5/15
See application file for complete search history.

(56) References Cited

U.S. PATENT DOCUMENTS

| | | | | |
|---|---|---|---|---|
| 5,353,934 | A | * | 10/1994 | Yamauchi ................. G03F 1/66 |
| | | | | 206/723 |
| 9,825,415 | B1 | * | 11/2017 | Lin ......................... H01R 24/68 |
| 11,095,065 | B2 | * | 8/2021 | Chang ................ H01R 13/4534 |
| 11,291,132 | B2 | * | 3/2022 | Lai .......................... H05K 5/064 |
| 2008/0266206 | A1 | * | 10/2008 | Nelson .................. G09F 9/3026 |
| | | | | 345/1.3 |
| 2014/0285987 | A1 | * | 9/2014 | Nagashima .............. H05K 7/12 |
| | | | | 361/759 |
| 2018/0375307 | A1 | * | 12/2018 | Kita .......................... H02G 5/08 |
| 2020/0236797 | A1 | * | 7/2020 | Stilianos ................ H05K 5/066 |
| 2022/0290800 | A1 | * | 9/2022 | Renken ................... F16C 11/12 |

* cited by examiner

*Primary Examiner* — Sagar Shrestha

*Assistant Examiner* — Peter Krim

(74) *Attorney, Agent, or Firm* — Billion & Armitage

(57) ABSTRACT

A bussed electrical center assembly may include a first housing containing an electrical component. A bussed electrical center assembly may also include a second housing configured to be mechanically attached to the first housing. The second housing defines a resilient cantilevered shock absorbing beam extending from the second housing. The shock absorbing beam is configured to be in compressive contact with the electrical component.

16 Claims, 9 Drawing Sheets

BUSSED ELECTRICAL CENTER ASSEMBLY WITH SHOCK ABSORBING BEAMS

TECHNICAL FIELD OF THE INVENTION

The disclosure generally relates to a bussed electrical center assembly, such as an automotive electrical power distribution center, with shock absorbing beams.

BACKGROUND

Relative movement between components of a bussed electrical center assembly, such as an automotive electrical power distribution center, caused by the assembly experiencing vibration can result in damage to the assembly. Open cell or closed cell polymer foam dampers may be placed between components susceptible to damage. However, the effectiveness of foam dampers may diminish over time due to material aging, compression setting, and/or wear.

BRIEF DESCRIPTION OF THE DRAWINGS

The present invention will now be described, by way of example with reference to the accompanying drawings, in which.

SUMMARY

In some aspects, the techniques described herein relate to a bussed electrical center assembly including a first housing containing an electrical component and a second housing configured to be mechanically attached to the first housing and defining a resilient cantilevered shock absorbing beam extending from the second housing. The shock absorbing beam is configured to be in compressive contact with the electrical component.

In some aspects, the techniques described herein relate to a bussed electrical center assembly housing including a first resilient cantilevered shock absorbing beam extending from the housing; a second resilient cantilevered shock absorbing beam extending from the housing and arranged opposite the first shock absorbing beam. The first and second shock absorbing beams are configured to be in compressive contact with an electrical component disposed between them.

In some aspects, the techniques described herein relate to a bussed electrical center assembly housing including a resilient cantilevered shock absorbing beam extending from the housing and a rigid support beam extending from the housing and arranged opposite the first shock absorbing beam. The shock absorbing beam and the rigid support beam are configured to be in compressive contact with an electrical component disposed between them.

DETAILED DESCRIPTION

Figure 1:
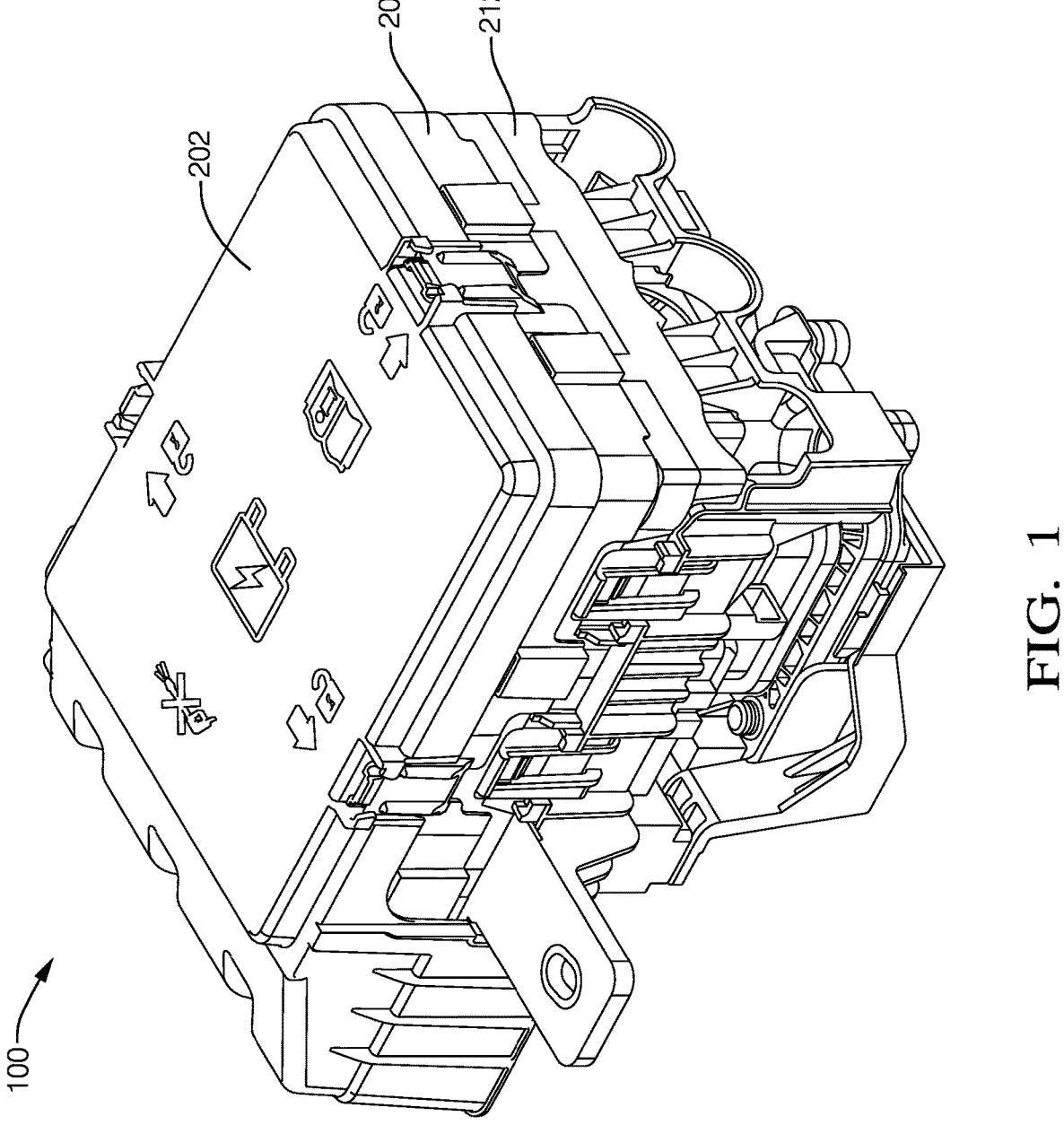
FIG. 1 is an isometric view of a bussed electrical center assembly in accordance with the prior art.
Figure 2A:
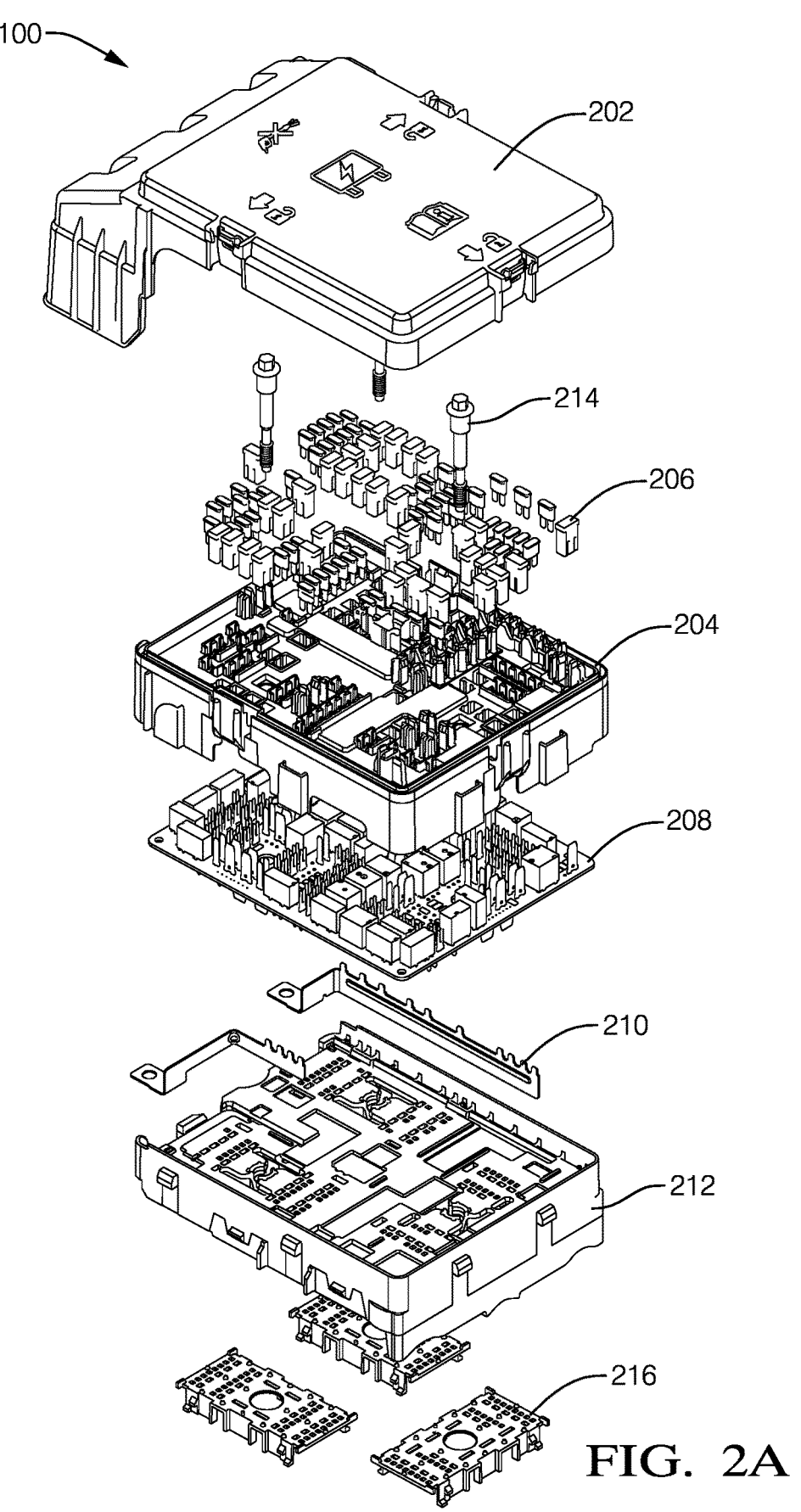
FIG. 2A is an exploded view of the bussed electrical center assembly of FIG. 1 in accordance with an embodiment of the invention.

A bussed electrical center assembly is presented herein. The bussed electrical center assembly, hereafter referred to as the assembly 100 is illustrated in FIGS. 1 and 2 and includes a cover 202, a first (upper) housing 204 which contains removable electrical devices, such as fuses 206. The assembly 100 also contains an electrical component, such as a printed circuit board (PCB) assembly 208 which includes rigid metallic bus bars 210. The PCB assembly 208 and bus bars 210 are disposed within a second (lower) housing 212. The assembly 100 may further incorporate fasteners 214 that will complete the connection with the harness connectors and male terminal blade stabilizers 216.

Figures 3A, 3B:
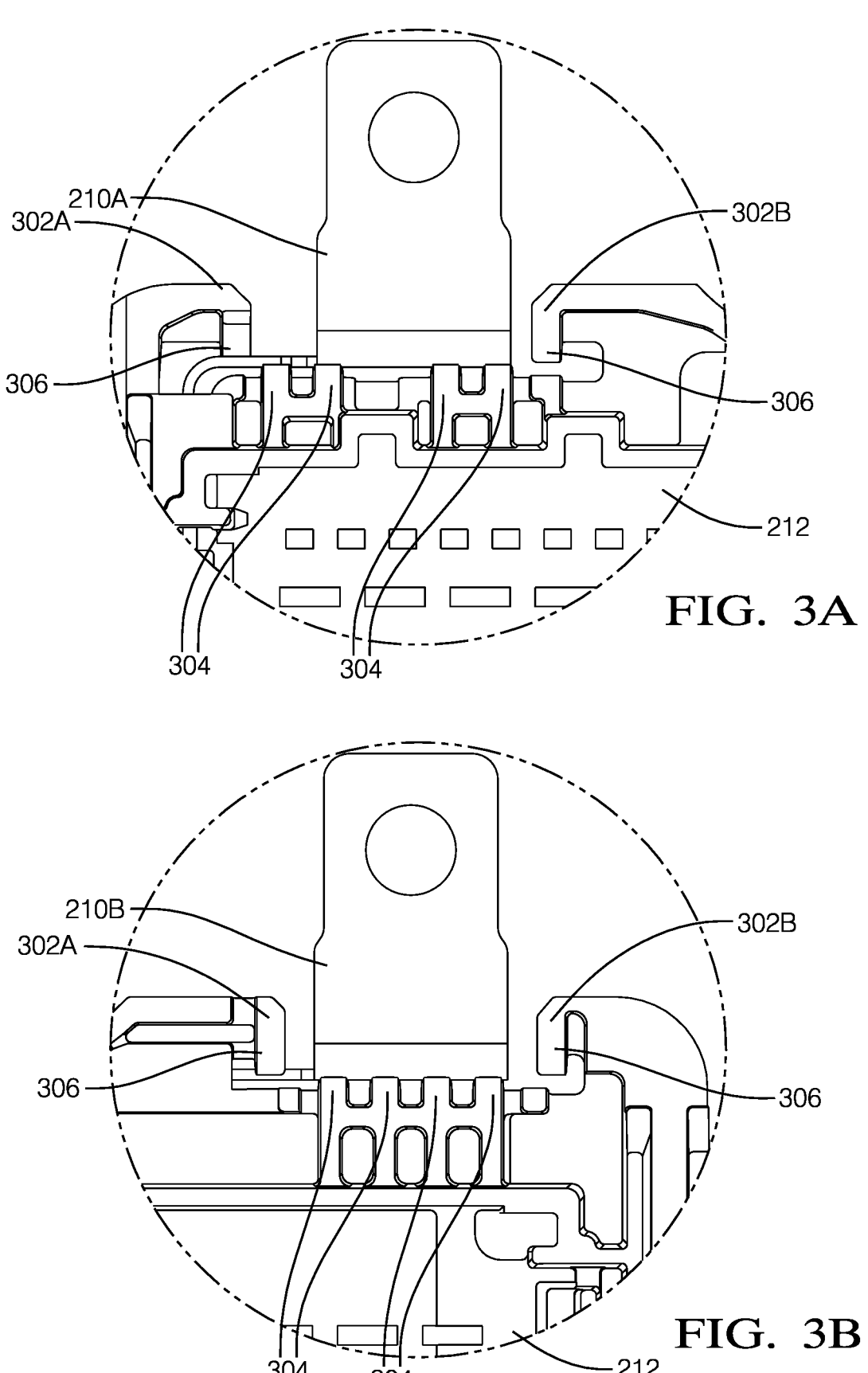
FIGS. 3A and 3B are bottom views of resilient cantilevered shock absorbing beams and rigid support beams in compressive contact with electrical components in accordance with an embodiment of the invention.
Figures 4A, 4B:
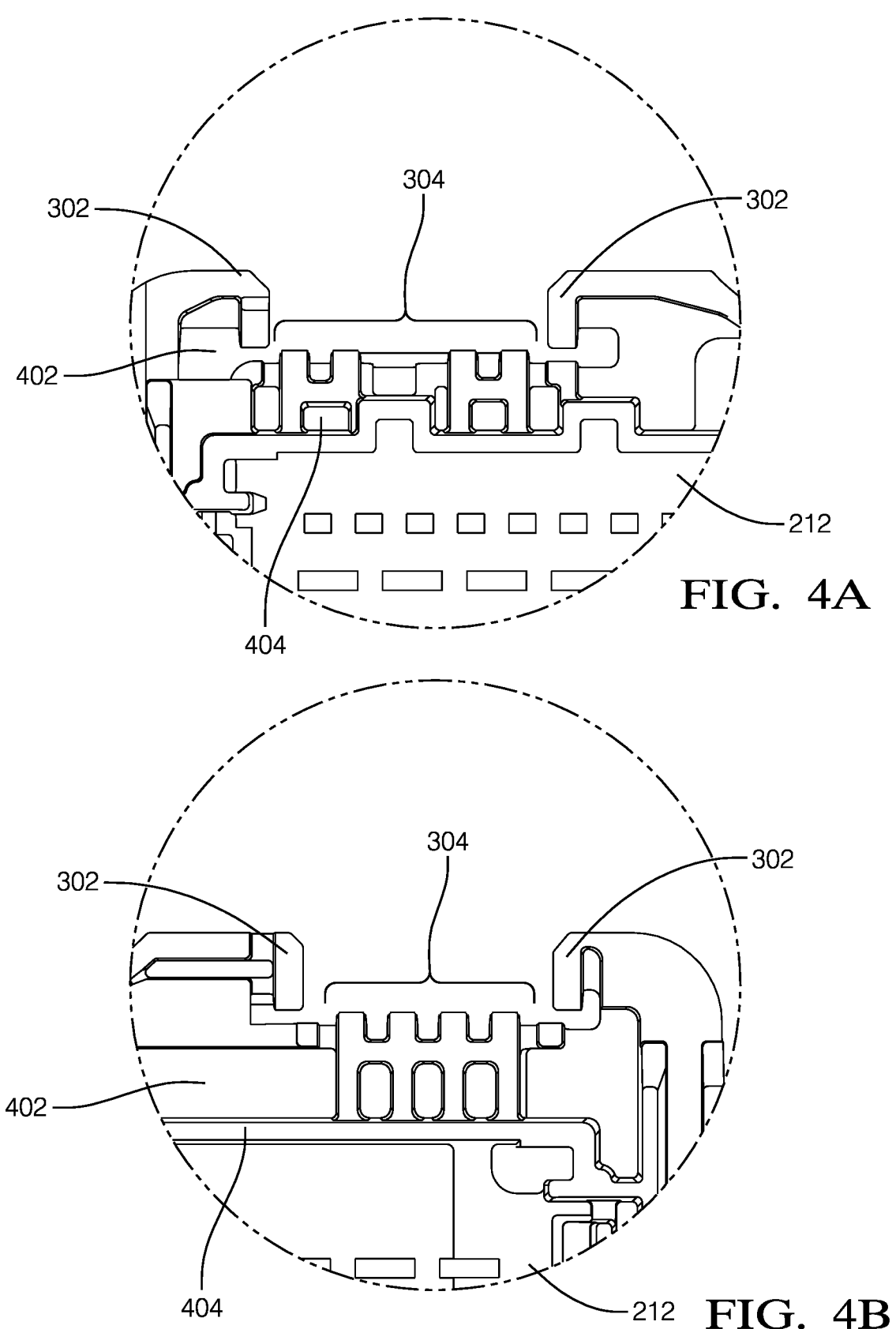
FIGS. 4A and 4B are bottom views of the resilient cantilevered shock absorbing beams and rigid support beams of FIGS. 3A and 3B in accordance with an embodiment of the invention.
Figures 5A, 5B:
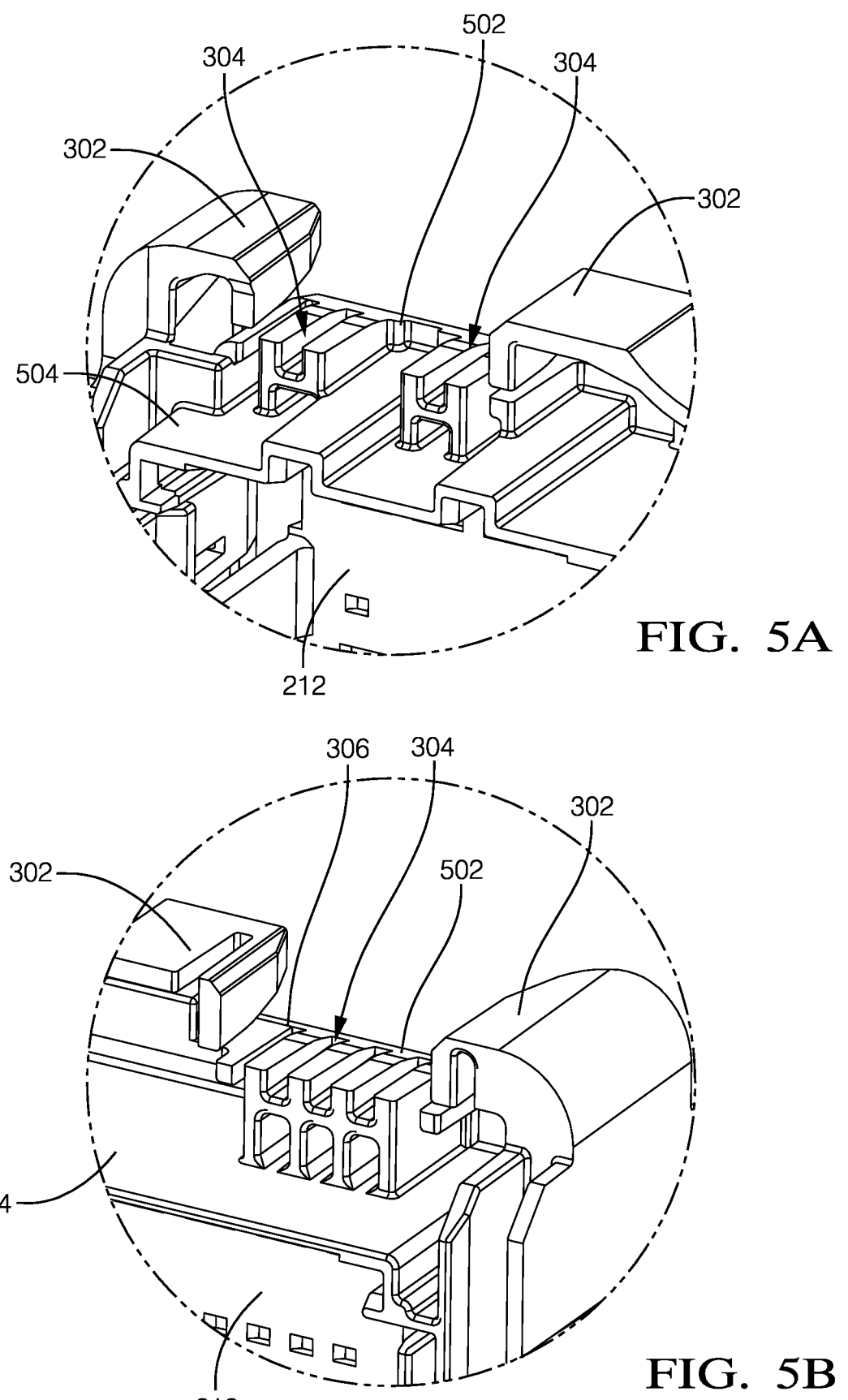
FIGS. 5A and 5B are isometric views of the resilient cantilevered shock absorbing beams and the rigid support beams of FIGS. 3A and 3B in accordance with an embodiment of the invention.

As shown in FIGS. 3A and 3B, a plurality of resilient cantilevered shock absorbing beams 302 extend from two separate locations on the second housing 212. As used herein, the term "resilient" means that the shock absorbing beams 302 are capable of being flexed by a force applied to them and return to their original shape without significant plastic deformation of the shock absorbing beams 302. The bus bars 210 are held within the second housing 212 by the shock absorbing beams 302. The bus bars 210 include a bus bar 210A and a second bus bar 210B that are both connected to an external electrical power source, such as a vehicle battery, to provide electrical power to the PCB assembly 208 within the assembly 100 The PCB assembly 208 provides electrical power to other circuits in the assembly 100. The shock absorbing beams 302 are in compressive contact with the bus bars 210. The shock absorbing beams 302 in the illustrated example are integrally formed with the second housing 212. The shock absorbing beams 302 and the second housing 212 may be formed of the same material, such as a glass-filled polymer material. The shock absorbing beams 302 have fixed ends that are attached to the second housing 212 and free ends that are in contact with the bus bars 210. The shock absorbing beams 302 generally form an L-shape and have contact pads 306 that extend substantially perpendicular from the shock absorbing beams 302. The contact pads 306 are in compressive contact with the bus bars 210 due to flexing of the shock absorbing beams 302 caused by an interference fit between the contact pads 306 and the bus bars 210. The L-shape of the shock absorbing beams 302 allow more compact packaging of the shock absorbing beams 302 in the assembly due to the shape allowing a shorter beam to provide a greater compressive force than a straight cantilever beam.

Figure 2B:
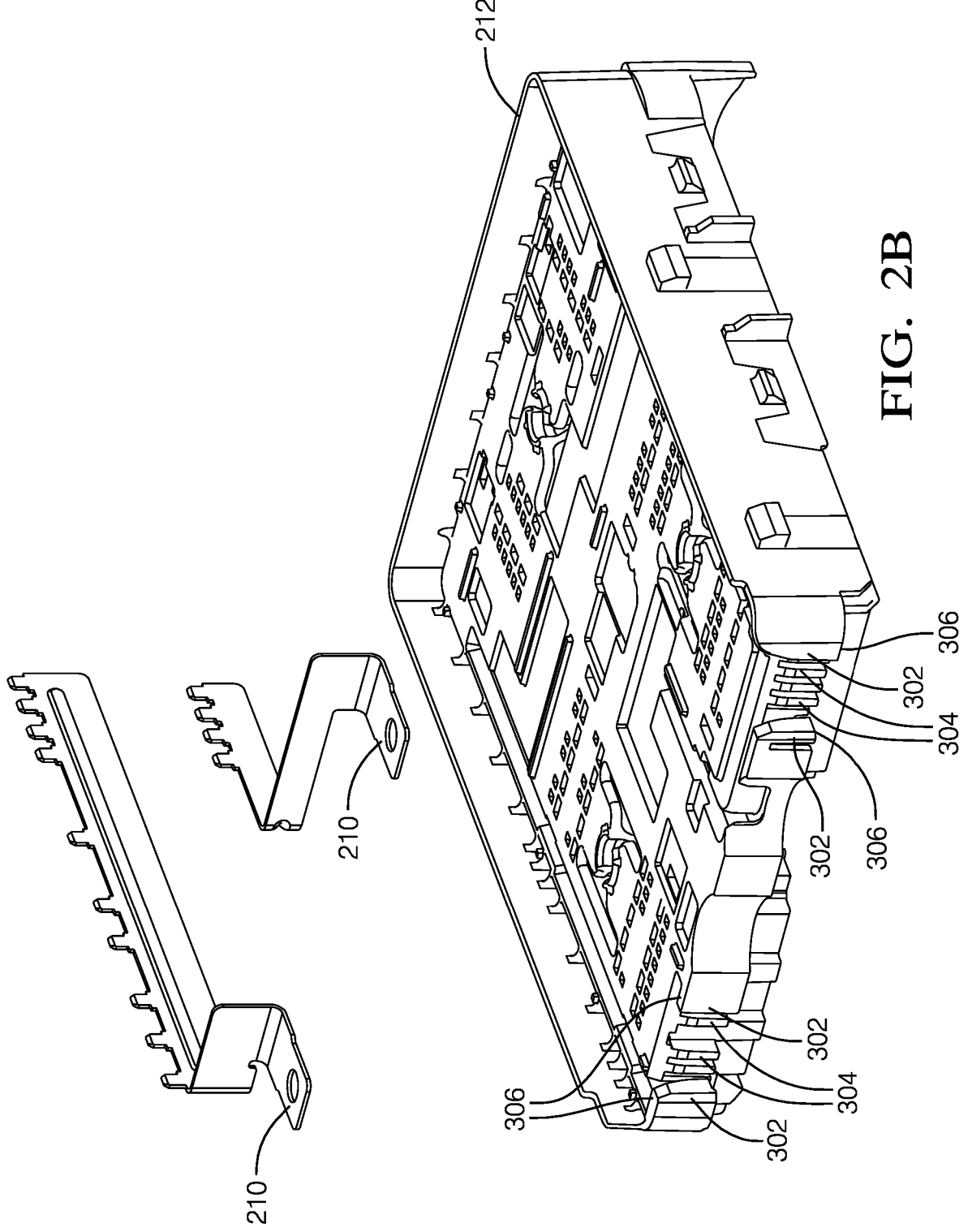
FIG. 2B is an isolated exploded view showing a lower housing and bus bars of the bussed electrical center assembly of FIG. 1 in accordance with an embodiment of the invention.

As shown in FIGS. 2B, 3A and 3B, there are two sets of shock absorbing beams 302 and rigid support beams 304, one set is configured to support the second bus bar 210B and the other set is configured to support the first bus bar 210A. Also, as shown in FIGS. 3A and 3B, there is one shock absorbing beam 302A that is in contact with the bus bar 210 and another shock absorbing beam 302B that is not. In alternative embodiments of the assembly 100, shock absorbing beam 302B may be in contact with the bus bar 210 while shock absorbing beam 302A is not or both shock absorbing beams 302A and 302B may be in contact with the bus bar 210, depending on the configuration of the bus bar 210.

The shock absorbing beams 302 are configured to absorb and or dampen vibratory motion between the second housing 212 and the bus bars 210 to prevent damage to the bus bars 210 or the second housing 212 that may be caused by this vibration.

In the example of the assembly 100 shown in FIGS. 3A-5B, the bus bars 210 are arranged intermediate, i.e., between the shock absorbing beams 302 and rigid support beams 304. As used herein, the term rigid means that a force sufficient to cause the rigid support beams 304 to flex will further cause plastic deformation of the rigid support beams 304. The compressive contact between the shock absorbing beams 302 and the bus bar 210 causes compressive contact between the rigid support beam 304 and the bus bar 210. The rigid support beams 304 may be integrally formed with the second housing 212 and formed of the same material as the second housing 212. The rigid support beams 304 extend in a first direction from a first surface 502 of the housing 212 and extend in a second direction from a second surface 504 of the housing 212. The second surface 504 of the housing 212 is substantially perpendicular to the first surface 502 of the housing 212.

In the example of the assembly 100 shown in FIGS. 6A-8B, the shock absorbing beam is a first shock absorbing beam 602, and the bus bar 210 is arranged intermediate the first shock absorbing beam 602 and a resilient cantilevered second shock absorbing beam 604 configured to also be in compressive contact with the bus bar 210. The second shock absorbing beams 604 are generally straight and extend from the second housing 212. The second shock absorbing beams 604 may be integrally formed with the second housing 212 and formed of the same material as the second housing 212. The first shock absorbing beams 602 generally have the same L-shape as the first shock absorbing beams 302 and define contact pads 606 that are arranged between the first shock absorbing beam 602 and are in contact with the bus bar 210. The compressive forces generated by the first shock absorbing beams 602 in an opposite direction to the compressive forces generated by the second shock absorbing beams 604.

Figures 6A, 6B:
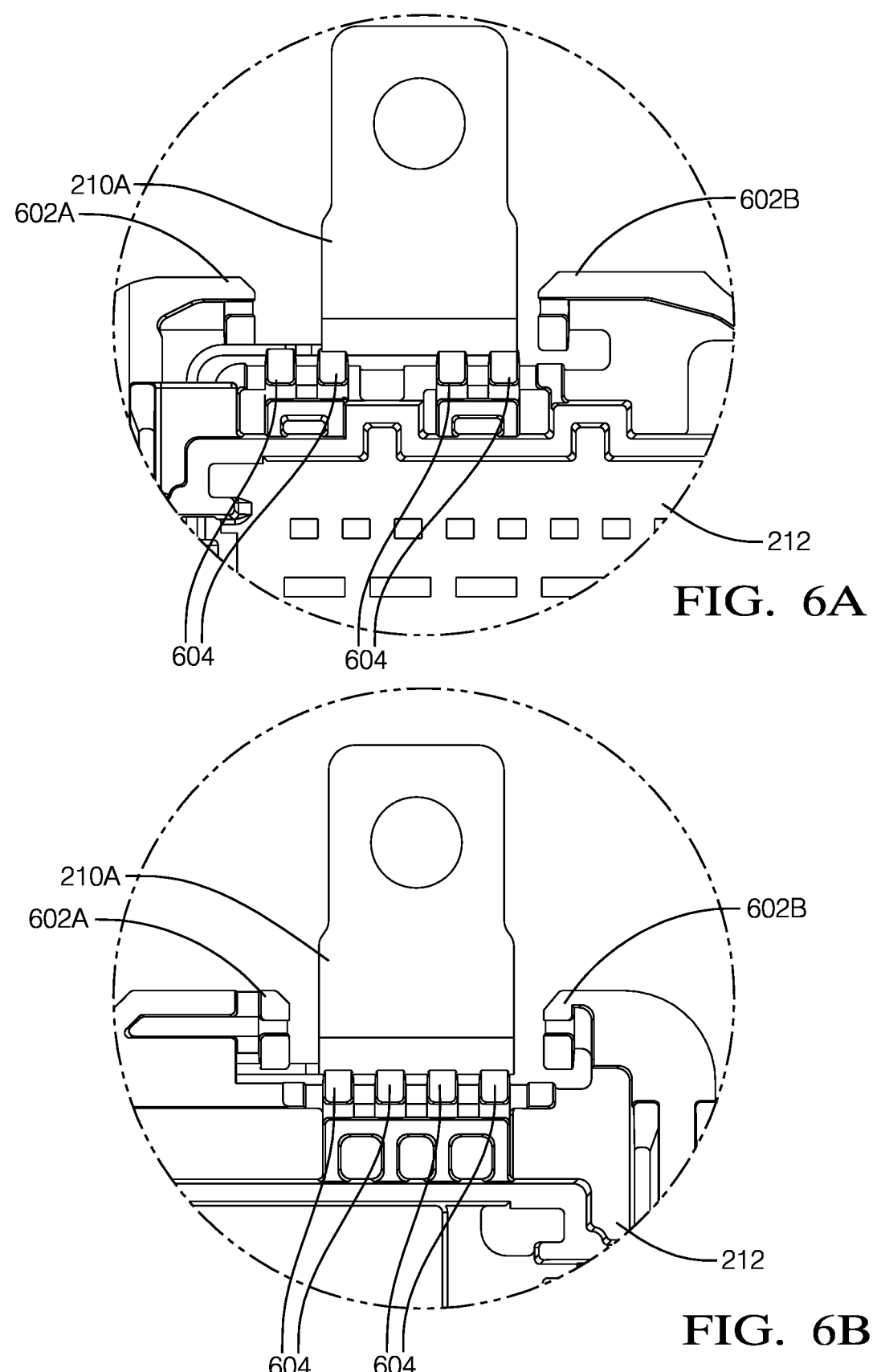
FIGS. 6A and 6B are bottom views of first and second flexible shock absorbing beams in compressive contact with electrical components in accordance with an embodiment of the invention.
Figures 7A, 7B:
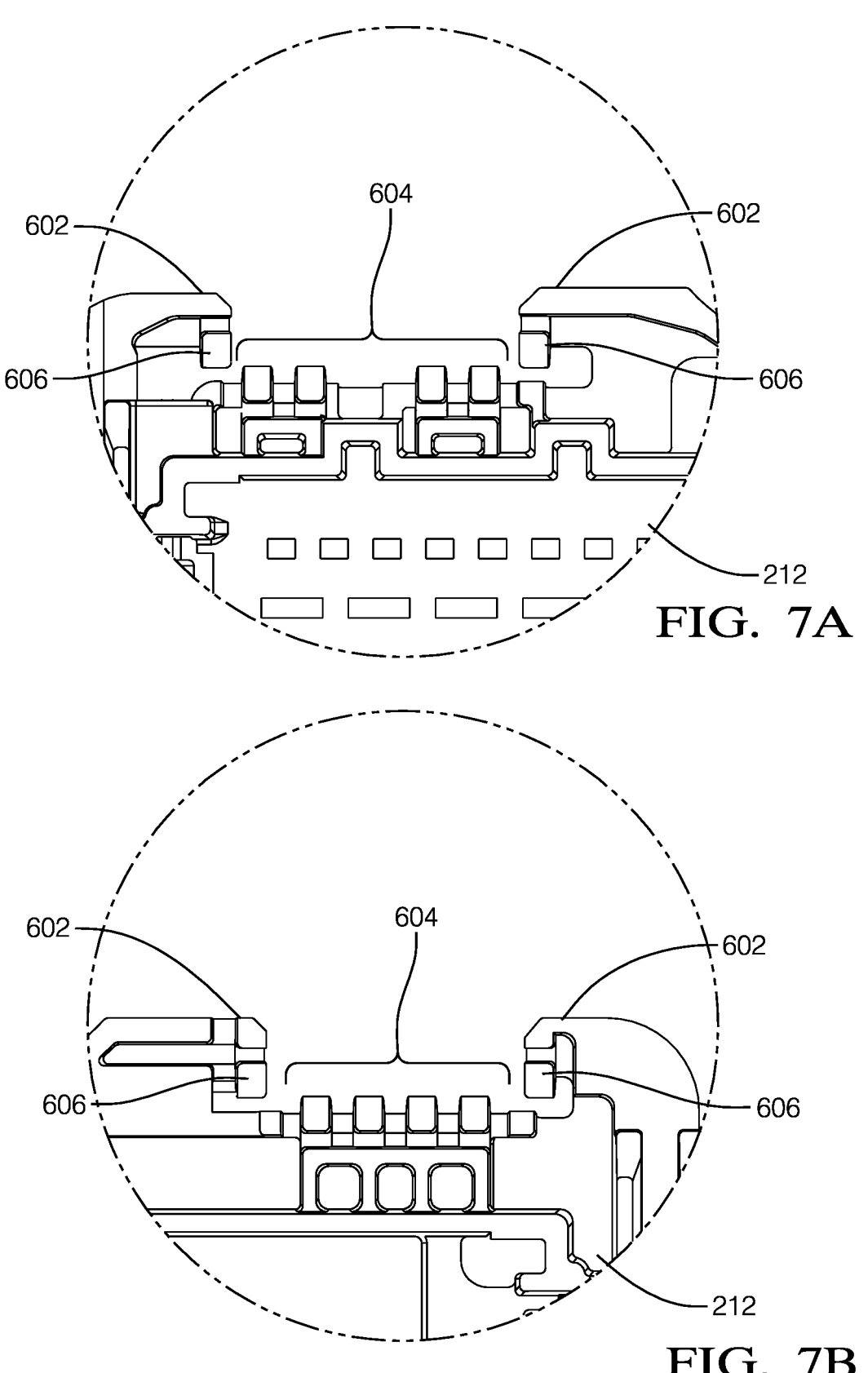
FIGS. 7A and 7B are bottom views of the first and second resilient cantilevered shock absorbing beams of FIGS. 6A and 6B in accordance with an embodiment of the invention.

As shown in FIGS. 6A and 6B, there are two sets of first flexible shock absorbing beams 602 and second shock absorbing beams 604, one set is configured to support the first bus bar 210A and the other set is configured to support the second bus bar 210B. Also, as shown in FIGS. 6A and 6B, there is one first shock absorbing beam 602A that is in contact with the bus bar 210 and another first shock absorbing beam 602B that is not. In alternative embodiments of the assembly 100, first shock absorbing beam 602B may be in contact with the bus bar 210 while first shock absorbing beam 602A is not or both shock absorbing beams 602A and 602B may be in contact with the bus bar 210, depending on the configuration of the bus bar 210.

The shock absorbing beams 602 are configured to absorb and or dampen vibratory motion between the second housing 212 and the bus bars 210 to prevent damage to the bus bars 210 or the second housing 212 that may be caused by this vibration.

Figures 8A, 8B:
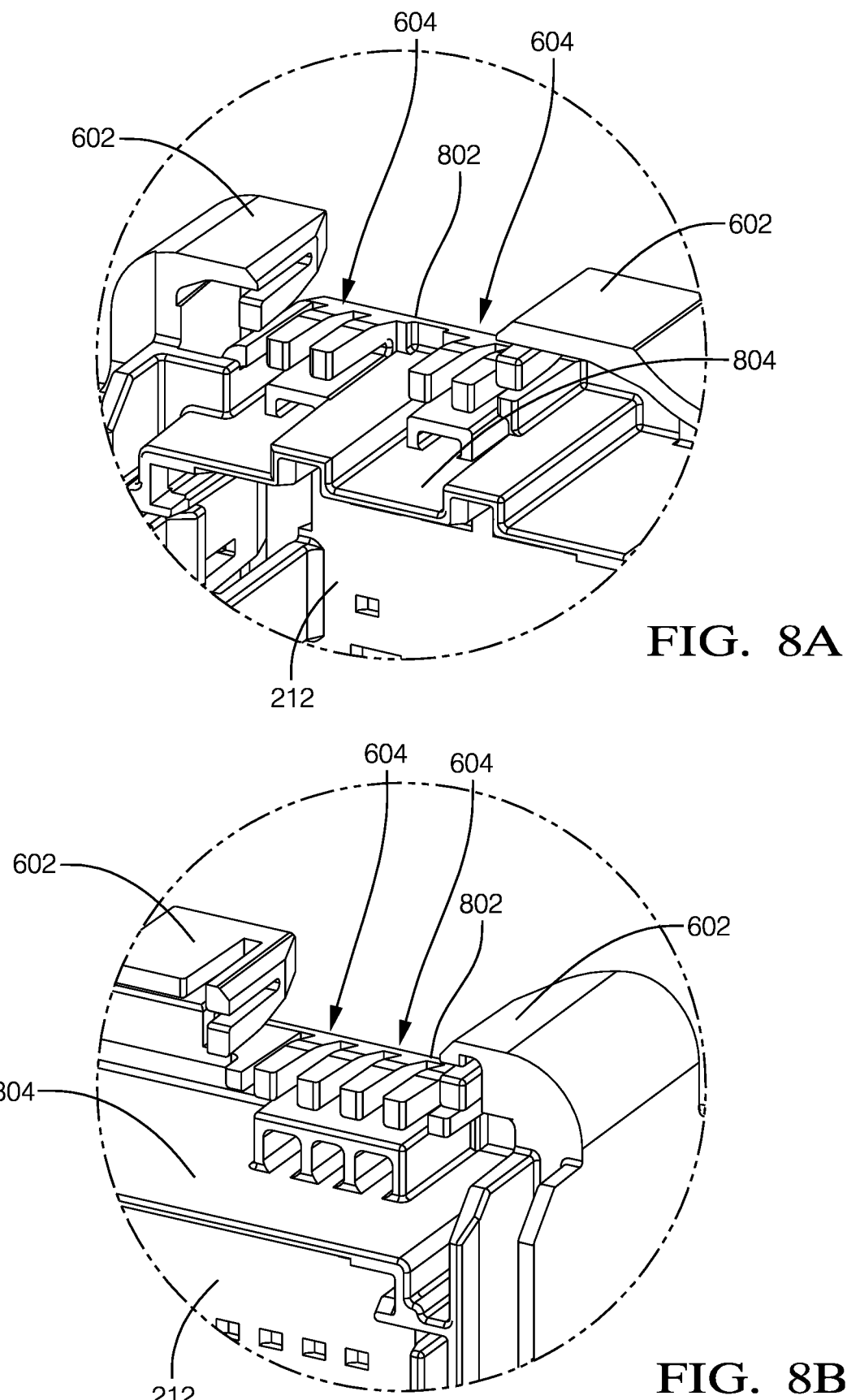
FIGS. 8A and 8B are isometric views of the first and second flexible shock absorbing beams of FIGS. 6A and 6B in accordance with an embodiment of the invention.

As shown in FIGS. 8A and 8B, the second shock absorbing beams 604 extend in a first direction from a first surface 802 of the housing 212. The housing 212 includes reinforcing beams 804 extending between the first surface 802 of the housing 212 and a second surface 804. The first surface 802 of the housing 212 is substantially perpendicular to the second surface 804 of the housing 212.

In alternative embodiments (not shown), rigid support beams may be implemented in place of the first shock absorbing beams 602 while retaining the second shock absorbing beams of the embodiment shown in FIGS. 6A-8B, substantially reversing the orientation of the shock absorbing beams 302 and rigid support beams 304 of the embodiment shown in FIGS. 3A-5B.

In some aspects, the techniques described herein relate to an bussed electrical center assembly, including: a first housing containing an electrical component; and a second housing configured to be mechanically attached to the first housing and defining a resilient cantilevered shock absorbing beam extending from the second housing, wherein the shock absorbing beam is configured to be in compressive contact with the electrical component.

In some aspects, the techniques described herein relate to a bussed electrical center assembly, wherein the shock absorbing beam defines a contact pad extending from the shock absorbing beam which is configured to be in compressive contact with the electrical component.

In some aspects, the techniques described herein relate to a bussed electrical center assembly, wherein the electrical component is a metallic bus bar.

In some aspects, the techniques described herein relate to a bussed electrical center assembly, wherein the shock absorbing beam is formed of a polymer-based material.

In some aspects, the techniques described herein relate to a bussed electrical center assembly, wherein the shock absorbing beam is formed of a glass-filled polymer material.

In some aspects, the techniques described herein relate to a bussed electrical center assembly, wherein the shock absorbing beam is integrally formed with the second housing.

In some aspects, the techniques described herein relate to a bussed electrical center assembly, wherein the shock absorbing beam and the second housing are formed of the same material.

In some aspects, the techniques described herein relate to a bussed electrical center assembly, wherein a length of the shock absorbing beam is greater than a width of the shock absorbing beam.

In some aspects, the techniques described herein relate to a bussed electrical center assembly, wherein the electrical component is arranged intermediate the shock absorbing beam and a rigid support beam.

In some aspects, the techniques described herein relate to a bussed electrical center assembly, wherein compressive contact between the shock absorbing beam and the electrical component causes compressive contact between the rigid support beam and the electrical component.

In some aspects, the techniques described herein relate to a bussed electrical center assembly, wherein the rigid support beam extends in a first direction from a first surface of the housing and extends in a second direction from a second surface of the housing, wherein the second surface of the housing is substantially perpendicular to the first surface of the housing.

In some aspects, the techniques described herein relate to a bussed electrical center assembly, wherein the rigid support beam is integrally formed with the second housing.

In some aspects, the techniques described herein relate to a bussed electrical center assembly, wherein the shock absorbing beam is a first shock absorbing beam and wherein the electrical component is arranged intermediate the first shock absorbing beam and a resilient cantilevered second shock absorbing beam configured to be in compressive contact with the electrical component.

In some aspects, the techniques described herein relate to a bussed electrical center assembly, wherein the second shock absorbing beam extends from the second housing.

In some aspects, the techniques described herein relate to a bussed electrical center assembly, wherein the shock absorbing beam is integrally formed with the second housing.

In some aspects, the techniques described herein relate to a bussed electrical center assembly housing, including: a first resilient cantilevered shock absorbing beam extending from the housing; and a second resilient cantilevered shock absorbing beam extending from the housing and arranged opposite the first shock absorbing beam, wherein the first and second shock absorbing beams are configured to be in compressive contact with an electrical component disposed between them.

In some aspects, the techniques described herein relate to a bussed electrical center assembly housing, wherein the first shock absorbing beam defines a contact pad extending from the shock absorbing beam which is configured to be in compressive contact with the electrical component.

In some aspects, the techniques described herein relate to a bussed electrical center assembly housing, including: a resilient cantilevered shock absorbing beam extending from the housing; and a rigid support beam extending from the housing and arranged opposite the shock absorbing beam, wherein the shock absorbing beam and the rigid support beam are configured to be in compressive contact with an electrical component disposed between them.

In some aspects, the techniques described herein relate to a bussed electrical center assembly housing, wherein compressive contact between the shock absorbing beam and the electrical component causes compressive contact between the rigid support beam and the electrical component.

While this invention has been described in terms of the preferred embodiments thereof, it is not intended to be so limited, but rather only to the extent set forth in the claims that follow. For example, the above-described embodiments (and/or aspects thereof) may be used in combination with each other. In addition, many modifications may be made to configure a particular situation or material to the teachings of the invention without departing from its scope. Dimensions, types of materials, orientations of the various components, and the number and positions of the various components described herein are intended to define parameters of certain embodiments and are by no means limiting and are merely prototypical embodiments.

Many other embodiments and modifications within the spirit and scope of the claims will be apparent to those of skill in the art upon reviewing the above description. The scope of the invention should, therefore, be determined with reference to the following claims, along with the full scope of equivalents to which such claims are entitled.

As used herein, 'one or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Additionally, while terms of ordinance or orientation may be used herein these elements should not be limited by these terms. All terms of ordinance or orientation, unless stated otherwise, are used for purposes distinguishing one element from another, and do not denote any particular order, order of operations, direction or orientation unless stated otherwise.

We claim:

1. A bussed electrical center assembly, comprising:
a first housing containing an electrical component; and
a second housing disposed adjacent to the first housing, the second housing configured to be mechanically attached to the first housing and defining a resilient cantilevered shock absorbing beam integrally formed with the second housing extending from the second housing in a direction transverse to a rigid support beam, the shock absorbing beam being configured to deform under compressive load to absorb mechanical shock transmitted to the electrical component.

2. The bussed electrical center assembly according to claim 1, wherein the shock absorbing beam defines a contact pad extending from the shock absorbing beam which is configured to be in compressive contact with the electrical component.

3. The bussed electrical center assembly according to claim 1, wherein the electrical component is a metallic bus bar.

4. The bussed electrical center assembly according to claim 1, wherein the shock absorbing beam is formed of a polymer-based material.

5. The bussed electrical center assembly according to claim 4, wherein the shock absorbing beam is formed of a glass-filled polymer material.

6. The bussed electrical center assembly according to claim 1, wherein the shock absorbing beam is integrally formed with the second housing.

7. The bussed electrical center assembly according to claim 1, wherein the shock absorbing beam and the second housing are formed of the same material.

8. The bussed electrical center assembly according to claim 1, wherein a length of the shock absorbing beam is greater than a width of the shock absorbing beam.

9. The bussed electrical center assembly according to claim 1, wherein the electrical component is arranged intermediate the shock absorbing beam and the rigid support beam.

10. The bussed electrical center assembly according to claim 9, wherein compressive contact between the shock absorbing beam and the electrical component causes compressive contact between the rigid support beam and the electrical component.

11. The bussed electrical center assembly according to claim 9, wherein the rigid support beam extends in a first direction from a first surface of the second housing and extends in a second direction from a second surface of the second housing and wherein the second surface of the second housing is substantially perpendicular to the first surface of the second housing.

12. The bussed electrical center assembly according to claim 9, wherein the rigid support beam is integrally formed with the second housing.

13. The bussed electrical center assembly according to claim 1, wherein the shock absorbing beam is a first shock absorbing beam and wherein the electrical component is arranged intermediate the first shock absorbing beam and a resilient cantilevered second shock absorbing beam configured to be in compressive contact with the electrical component.

14. The bussed electrical center assembly according to claim 13, wherein the second shock absorbing beam extends from the second housing.

15. The bussed electrical center assembly according to claim 13, wherein the first shock absorbing beam is integrally formed with the second housing.

16. A bussed electrical center assembly housing, comprising:

a first resilient cantilevered shock absorbing beam extending from the housing;

a second resilient cantilevered shock absorbing beam extending from the housing, the second shock absorbing beam being arranged opposite the first shock absorbing beam such that compressive forces generated by the second shock absorbing beam is in a direction opposite to the compressive forces generated by the first shock absorbing beam, the first and second shock absorbing beams are configured to be in compressive contact with an electrical component disposed between them; and wherein the first shock absorbing beam defines a contact pad extending from the shock absorbing beam which is configured to be in compressive contact with the electrical component.

* * * * *